(12) United States Patent
Match et al.

(10) Patent No.: US 11,837,481 B2
(45) Date of Patent: Dec. 5, 2023

(54) WAFER CHUCKING MONITOR

(71) Applicant: Advanced Energy Industries, Inc., Denver, CO (US)

(72) Inventors: Peter Match, South Setauket, NY (US); Carlos Alicea, Medford, NY (US)

(73) Assignee: Advanced Energy Industries, Inc., Denver, CO (US)

( * ) Notice: Subject to any disclaimer, the term of this patent is extended or adjusted under 35 U.S.C. 154(b) by 0 days.

(21) Appl. No.: 18/087,502

(22) Filed: Dec. 22, 2022

(65) Prior Publication Data
US 2023/0130919 A1 Apr. 27, 2023

Related U.S. Application Data

(63) Continuation of application No. 17/143,960, filed on Jan. 7, 2021, now Pat. No. 11,562,918.

(51) Int. Cl.
*H01T 23/00* (2006.01)
*H01L 21/67* (2006.01)
*H01L 21/66* (2006.01)
*H01L 21/683* (2006.01)
*H02N 13/00* (2006.01)

(52) U.S. Cl.
CPC .... *H01L 21/67259* (2013.01); *H01L 21/6833* (2013.01); *H01L 22/14* (2013.01); *H02N 13/00* (2013.01)

(58) Field of Classification Search
None
See application file for complete search history.

(56) References Cited

U.S. PATENT DOCUMENTS

| | | | | |
|---|---|---|---|---|
| 5,872,694 A | * | 2/1999 | Hoinkis | H01L 21/6831 361/234 |
| 7,558,045 B1 | * | 7/2009 | Onate | H01L 21/67259 361/234 |
| 2010/0142113 A1 | * | 6/2010 | Lee | H01L 21/6831 361/234 |
| 2018/0131293 A1 | * | 5/2018 | Wang | G01R 27/2605 |

* cited by examiner

*Primary Examiner* — Stephen W Jackson
(74) *Attorney, Agent, or Firm* — Neugeboren O'Dowd PC

(57) ABSTRACT

This disclosure describes systems, methods, and apparatus for non-invasive wafer chuck monitoring using a low voltage AC signal injected into a high voltage DC chucking voltage provided to a wafer chuck. Monitoring the injected signal can provide insight into the wafer chucking state and remedial actions, such as realignment of the wafer with the wafer chuck, can be carried out. Because of the low voltage nature of the AC signal, wafer chuck monitoring can be performed without influencing chucking performed by the higher voltage DC chucking voltage.

15 Claims, 8 Drawing Sheets

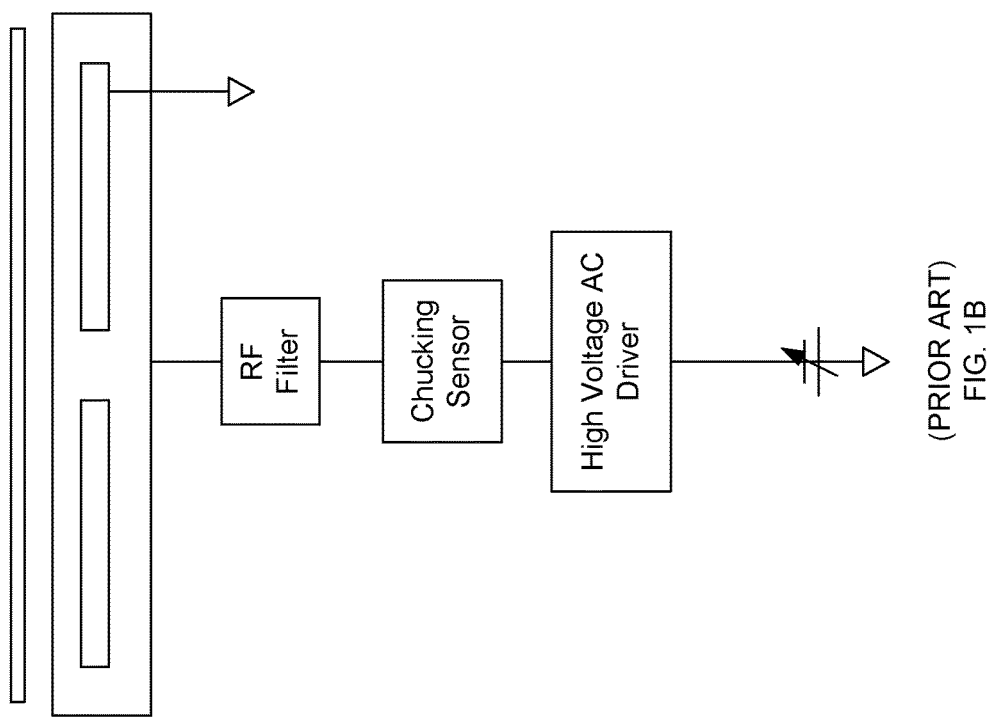
(PRIOR ART) FIG. 1B
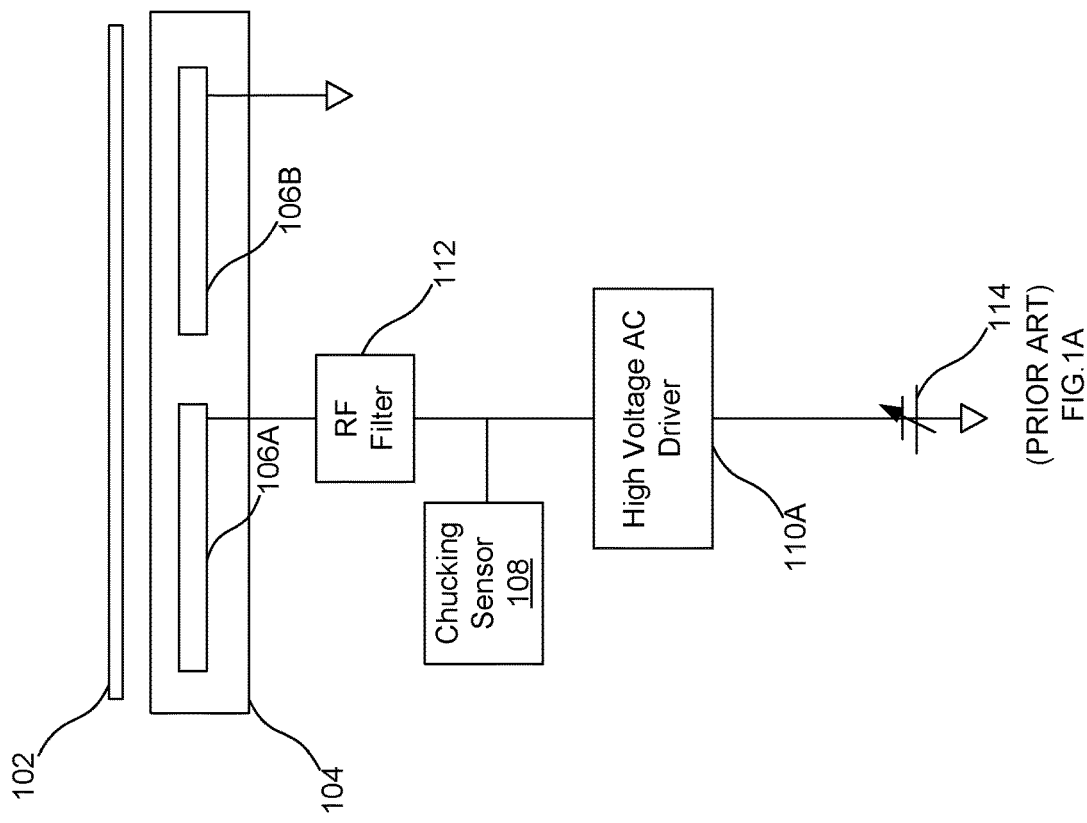
(PRIOR ART) FIG. 1A

WAFER CHUCKING MONITOR

CLAIM OF PRIORITY (35 U.S.C. § 120)

The present Application for Patent is a Continuation of patent application Ser. No. 17/143,960 entitled "WAFER CHUCKING MONITOR USING HIGH FREQUENCY INJECTED AC SIGNAL" filed Jan. 7, 2021, pending, and assigned to the assignee hereof and hereby expressly incorporated by reference herein.

FIELD OF THE DISCLOSURE

The present disclosure relates generally to plasma processing. In particular, but not by way of limitation, the present disclosure relates to systems, methods and apparatuses for non-contact monitoring of a state of a wafer chuck.

DESCRIPTION OF RELATED ART

Plasma processing of workpieces, typically semiconductor wafers, in vacuum chambers is usually performed by electrically exciting a suitable gas pumped into a chamber having a pressure in the range of about 0.5-5.0 mTorr. The gas is excited to a plasma state by supplying electric energy from a source outside of the chamber to the plasma, often via capacitively or inductively-coupled electrodes. A chuck holds the workpiece in situ while the plasma is treating the workpiece, to deposit molecules on the workpiece, or to etch the workpiece. The workpiece is placed on the chuck by an automatic positioning device having arms located in the chamber. After the workpiece is placed on the chuck by the automatic positioning device, the chuck is activated to hold the workpiece securely in place during processing by the plasma.

Electrostatic chucks, as disclosed, for example, by Logan et al., U.S. Pat. No. 5,099,571, have been extensively used for holding workpieces in situ in vacuum chambers during plasma processing. Typically, such electrostatic chucks include first and second mutually insulated electrodes to which is applied a DC voltage for producing an electrostatic force across the electrodes. The electrostatic force is coupled to the workpiece to clamp the workpiece in place on the electrostatic chuck.

A problem with prior art plasma processors in vacuum chambers is that the workpiece is sometimes not correctly placed on the chuck prior to the chuck applying a gripping force to the workpiece, or becomes dislodged during operation (e.g., due to the presence of dirt or a cracked workpiece). If the workpiece is not properly located or placed on the chuck, the chuck and/or workpiece are susceptible to severe damage or improper processing. The damage is costly to an owner of the plasma processor because of the expense associated with repair of the chuck and destruction of the workpiece, which may previously have had substantial costly operations performed on it. In addition, operation of the plasma processor is interrupted, with attendant costs associated with down time thereof.

SUMMARY OF THE DISCLOSURE

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

Some embodiments of the disclosure may be characterized as plasma processing system configured to non-invasively monitor wafer chucking. The plasma processing system can comprise a plasma processing chamber, a wafer chuck, a high voltage power source, a low voltage AC chuck monitoring source, a blocking capacitor, a chucking sensor, a band stop filter, and a controller. The wafer chuck can be arranged within the plasma processing chamber and can be configured to support a substrate and hold the substrate through capacitive coupling. The high voltage power source can be configured to provide high voltage to the wafer chuck. The low voltage AC chuck monitoring source can be ground referenced and can be configured to provide a low voltage AC monitoring signal to the wafer chuck via a node between the wafer chuck and the high voltage power source. The blocking capacitor can be arranged between the low voltage AC chuck monitoring source and the node. The chucking sensor can be arranged between the blocking capacitor and the low voltage AC chuck monitoring source and configured to monitor current and voltage on a low voltage side of the blocking capacitor. The band stop filter can be arranged between the node and the high voltage power source. The controller can be configured to receive the current and voltage from the chucking sensor and control the high voltage power source or a wafer transfer unit in response to inferring from the current and voltage that a substrate is improperly chucked on the wafer chuck.

Other embodiments of the disclosure may also be characterized as a wafer chucking supply for a plasma processing system. The wafer chucking supply can comprise a high voltage power source, a low voltage AC chuck monitoring source, a means of preventing the high voltage from reaching the AC chuck monitoring source, a chucking sensor, a band stop filter, and a controller. The high voltage power source can be configured to provide high voltage to a wafer chuck in a plasma processing chamber, and in some embodiments can be implemented as a DC power supply with a constant output or an amplifier with a variable output. The low voltage AC chuck monitoring source can be ground referenced and can be configured to provide a low voltage AC monitoring signal to the wafer chuck via a node between the wafer chuck and the high voltage power source. The means of preventing the high voltage from reaching the AC chuck monitoring source can be arranged between the low voltage AC chuck monitoring source and the node. The chucking sensor can be arranged between the means of preventing and the low voltage AC chuck monitoring source, the chucking sensor can also be configured to monitor current and voltage on a low voltage side of the means of preventing. The band stop filter can be arranged between the node and the high voltage power source. In some implementations, an RF filter can be arranged between the node and the wafer chuck. The controller can be configured to receive the current and voltage from the chucking sensor and control the high voltage power source in response to inferring from the current and voltage that a substrate is improperly chucked on the wafer chuck.

Other embodiments of the disclosure can be characterized as a method comprising: applying a DC chucking voltage to a wafer chuck in a plasma processing chamber via a high voltage power source; applying a low voltage AC monitoring signal to the wafer chuck in parallel to the DC chucking voltage via a low voltage AC chuck monitoring source that is ground referenced; preventing the DC chucking voltage from reaching the low voltage AC chuck monitoring source via a blocking capacitor arranged between the low voltage AC chuck monitoring source and a node on the high voltage line, the node arranged between the high voltage power source and the plasma processing chamber; preventing the low voltage AC monitoring signal from reaching the high voltage power source via a band stop filter arranged between the node and the high voltage power source; sensing current and voltage between the low voltage AC chuck monitoring supply and the blocking capacitor; and analyzing the current and voltage between the low voltage AC chuck monitoring supply and the blocking capacitor to ascertain a chucking state of the wafer chuck.

Some embodiments of the disclosure may be characterized as plasma processing system configured to non-invasively monitor wafer chucking. The plasma processing system can comprise a plasma processing chamber, a wafer chuck, a high voltage power source, a low voltage AC chuck monitoring source, a blocking capacitor, a chucking sensor, a band stop filter, and a controller. The wafer chuck can be arranged within the plasma processing chamber and can be configured to support a substrate and hold the substrate through capacitive coupling. The high voltage power source can be configured to provide high voltage to the wafer chuck. The low voltage AC chuck monitoring source can be ground referenced and can be configured to provide a low voltage AC monitoring signal to the wafer chuck via a node between the wafer chuck and the high voltage power source. The blocking capacitor can be arranged between the low voltage AC chuck monitoring source and the node. The chucking sensor can be arranged between the blocking capacitor and the low voltage AC chuck monitoring source and configured to monitor current and voltage on a low voltage side of the blocking capacitor. The band stop filter can be arranged between the node and the high voltage power source. The controller can comprise a non-transitory, tangible computer readable storage medium, encoded with processor readable instructions to perform a method for non-invasive monitoring of wafer chucking in a plasma processing chamber, the method comprising: analyzing the current and voltage measured by the chucking sensor and controlling the high voltage power source or a wafer transfer unit in response to inferring from the current and voltage that a substrate is improperly chucked on the wafer chuck.

BRIEF DESCRIPTION OF THE DRAWINGS

Various objects and advantages and a more complete understanding of the present disclosure are apparent and more readily appreciated by referring to the following detailed description and to the appended claims when taken in conjunction with the accompanying drawings:

FIG. 1A shows a known wafer chucking assembly;

FIG. 1B shows another known wafer chucking assembly;

DETAILED DESCRIPTION

Figure 2:
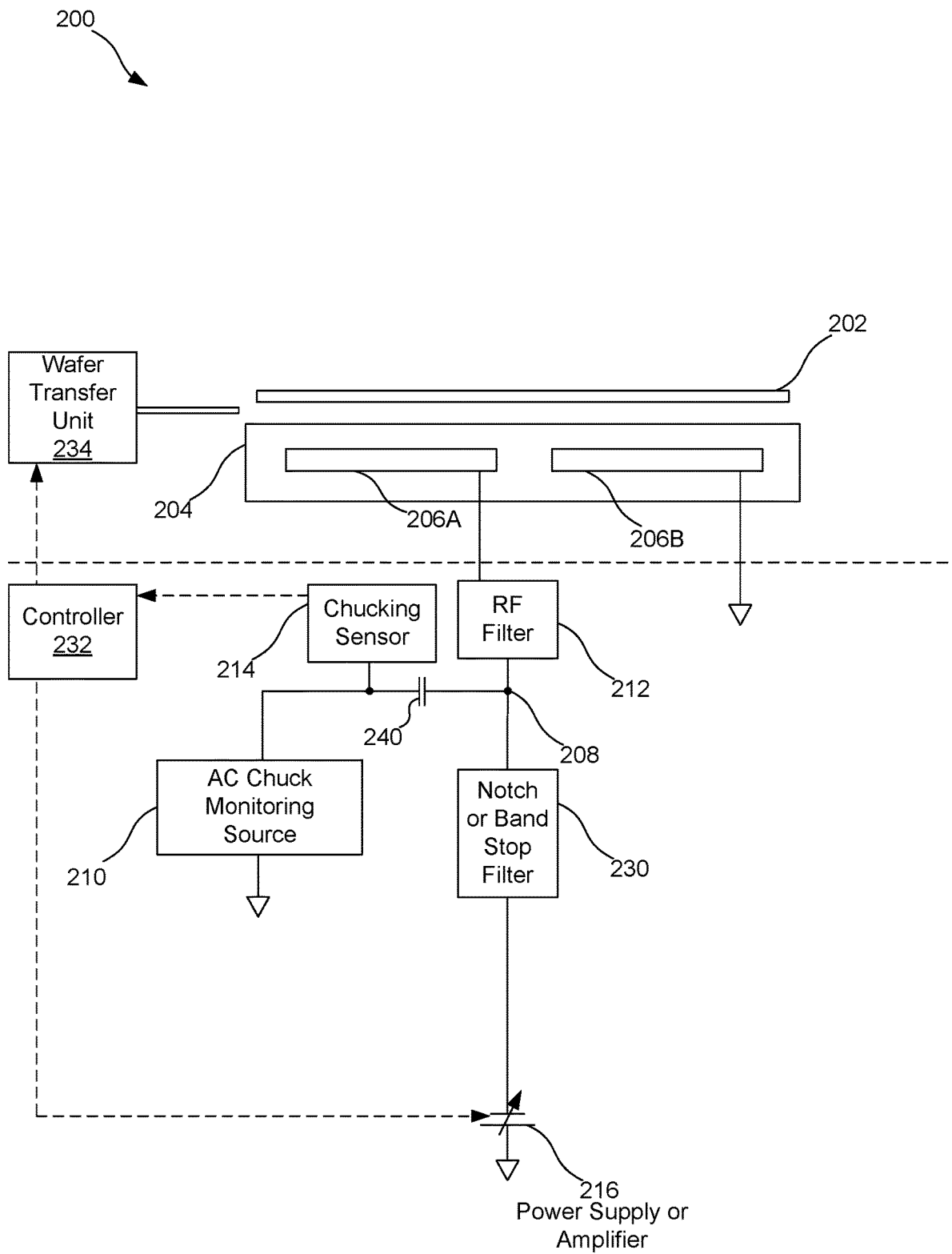
FIG. 2 illustrates a novel embodiment of a wafer chucking assembly using a ground-referenced low voltage AC injection signal.

The present disclosure relates generally to plasma processing. In particular, but not by way of limitation, the present disclosure relates to systems, methods and apparatuses for non-contact monitoring of a state of a wafer chuck.

The word "exemplary" is used herein to mean "serving as an example, instance, or illustration." Any embodiment described herein as "exemplary" is not necessarily to be construed as preferred or advantageous over other embodiments.

Preliminary note: the flowcharts and block diagrams in the following Figures illustrate the architecture, functionality, and operation of possible implementations of systems, methods and computer program products according to various embodiments of the present disclosure. In this regard, some blocks in these flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

It is, accordingly, an object of the present disclosure to provide a new and improved method of and apparatus for operating a chuck for holding a workpiece in situ in a vacuum chamber of a plasma processor vacuum chamber.

Another object of the disclosure is to provide a new and improved method of and apparatus for operating an electrostatic chuck in a plasma processor vacuum chamber, such that the chuck is operated in a way to reduce the likelihood of damage to the chuck and a processed workpiece.

Another object of the disclosure is to provide a new and improved method of and apparatus for operating an electrostatic chuck in a plasma processor vacuum chamber wherein the chuck is activated only when a workpiece thereon has been determined as being properly in place on the chuck.

Another object of the disclosure is to provide a new and improved method of and apparatus for automatically detecting whether the workpiece on the chuck in the evacuated chamber is properly positioned using voltage and current measurements of an injected low voltage AC signal isolated from a high voltage chucking supply via a blocking capacitor.

The foregoing objects are achieved in accordance with one aspect of the disclosure by providing a method of treating a workpiece within a plasma in an evacuated chamber including a source of the plasma and a chuck for selectively holding the workpiece by placing the workpiece on the chuck in the evacuated chamber and then automatically detecting whether the workpiece is properly positioned on the chuck. The detecting is performed via injection of a low voltage AC signal in parallel with a high voltage chucking source, where the low voltage AC source is protected from the high voltage line via a blocking capacitor. A sensor can monitor current and voltage on the low voltage side of the blocking capacitor, calculate chuck impedance from this current and voltage, determine capacitance from the impedance, and thereby determine whether the wafer is properly positioned on the chuck. The chuck is activated to hold the workpiece in situ in response to the automatic detecting step indicating the workpiece is properly positioned on the chuck. The workpiece held in situ on the chuck is then treated with the plasma.

The chuck is preferably an electrostatic chuck having first and second electrically insulated electrodes. Such a chuck is activated to hold the workpiece in situ by applying an attractive electrostatic force to the workpiece via the electrodes. The automatic detecting step can be performed by measuring a capacitance across the electrodes prior to application of the electrostatic force to the workpiece via the electrodes, or during application of the electrostatic force.

Existing automatic chucking detection has been performed via a high voltage AC signal applied in series with a high voltage chucking supply to the chuck, as illustrated in FIGS. 1A and 1B, for instance. A chucking sensor can monitor the high voltage current and voltage and thereby determine whether the workpiece is properly positioned. The AC signal can either be supplied by an AC power source, by modulating a DC power source, or by passing the high voltage DC signal through an amplifier that modulates the signal. However, all of these alternatives are performed at high voltage and are difficult to modulate at frequencies high enough to meet current demands (e.g., ~100 kHz). Furthermore, use of an amplifier leads to hotter operation, more costly components, and greater system complexity.

This disclosure overcomes the challenges of existing designs by injecting a low voltage, but high frequency (e.g., 1 kHz-100 kHz), AC signal from a ground-referenced current or voltage source through a blocking capacitor and into the high voltage line between the high voltage power supply and the chuck. This sensing circuit allows higher frequency monitoring than was possible in the prior art, while also preventing the injected current from reaching the high voltage power supply.

FIG. 2 illustrates a chucking assembly for a plasma processing system according to one embodiment. The assembly includes a wafer chuck 204, a workpiece 202 arranged in contact with the wafer chuck 204, and at least two electrodes 206A, 206B in the wafer chuck 204 that provide the high voltage chucking energy to the wafer chuck 204. These are powered by a high voltage power supply 216 or amplifier 216. An AC chuck monitoring source 210 (a ground-referenced current or voltage source) can provide an AC signal of lower current/voltage than provided by the high voltage power supply or amplifier 216, and accordingly will be referred to as a low-voltage source or a low voltage AC chuck monitoring source. This injected signal can be arranged in parallel to the high voltage line and can be injected to or meet the high voltage line at node 208. A chucking sensor 214 can couple to a low voltage side of a blocking capacitor 240, which can be arranged between the AC chuck monitoring source 210 and the node 208. The blocking capacitor 240 can be selected to prevent high voltage from reaching the AC chuck monitoring source 210 or a chucking sensor 214. The blocking capacitor 240 may have a value selected to be much greater than a capacitance of the load or wafer chuck 204 and workpiece 202. A notch or band stop filter 230 can be arranged between the node 208 and the high voltage power supply or amplifier 216 thereby preventing frequencies that match the injected frequency from reaching the high voltage power supply or amplifier 216. For instance, the injected frequency can be between 1 kHz and 100 kHz. An RF filter 212 can be arranged between the node 208 and the wafer chuck 204.

As the low voltage injected signal is modulated, the chucking sensor 214 monitors the injected signal between the AC chuck monitoring source 210 and the blocking capacitor 240. The chucking sensor 214 can monitor current and voltage on the injection line and determine an impedance of the chuck 204 based on these measurements, and from there determine a capacitance of the workpiece 202. This capacitance can be used to ascertain a quality or state of the chucking, and feedback can either be provided to an operator or used in an autonomous feedback loop to adjust parameters of the chucking (e.g., power supply or amplifier 216 power or frequency). For instance, the feedback can be presented to an operator in the form of a warning against fully engaging the chucking voltage if chucking is moving forward, or a warning against moving forward with a process of removing the substrate if de-chucking is not complete. For instance, the chucking sensor 214 can provide measurements or feedback to a controller 232, that can adjust the power supply or amplifier 216 and/or adjust a location of the workpiece 202 via a wafer transfer unit 234. The wafer transfer unit 234 can be implemented as any number of different automated systems within a plasma processing chamber able to move the workpiece 202. The wafer transfer unit 234 may include one or more arms, a thin platform, or any other structure for lifting and moving the workpiece 202. In some cases, the wafer transfer unit 234 is contained entirely within the plasma processing chamber, while in others the wafer transfer unit 234 may be able to move between different vacuum chambers, for instance in a wafer processing assembly that performs batch wafer processing via multiple vacuum chambers.

Since the AC chuck monitoring source 210 can be designed independently from the high voltage requirements placed on the high voltage power supply or amplifier 216, the low voltage AC chuck monitoring source 210 can be selected to operate at a higher frequency than the high voltage power supply or amplifier 216. However, these two frequencies can also be synchronized, to the extent possible, to minimize beat frequency issues.

Figure 3:
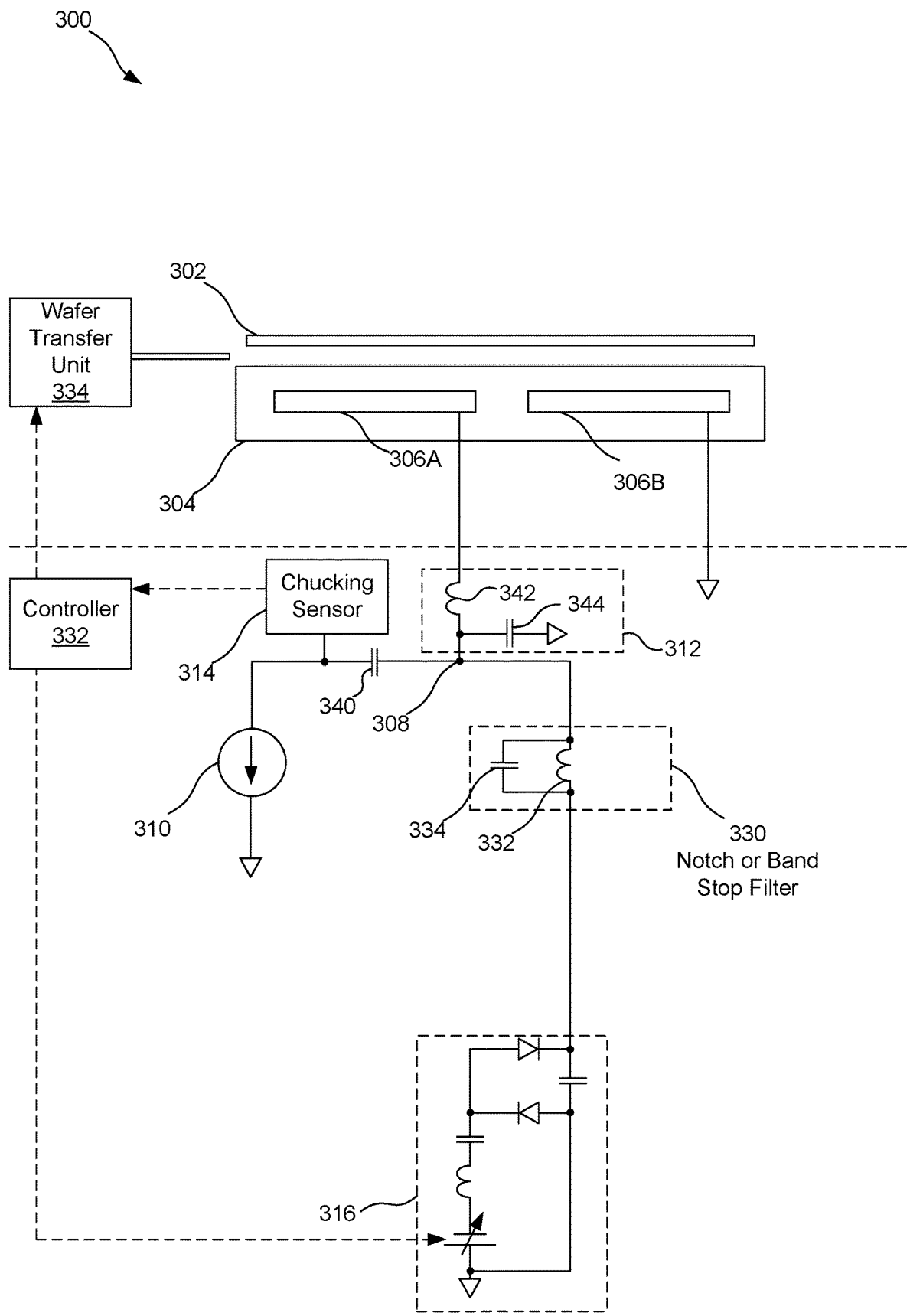
FIG. 3 illustrates another novel embodiment of a wafer chucking assembly using a ground-referenced low voltage AC injection signal.

FIG. 3 illustrates additional details of the assembly seen in FIG. 2. The assembly includes a wafer chuck 304, a workpiece 302 arranged in contact with the wafer chuck 304, and two or more electrodes 306A, 306B in the wafer chuck 304 that provide the high voltage chucking energy to the wafer chuck 304. These are powered by a high voltage power supply or amplifier 316. A ground-referenced AC current source 310 can provide an AC signal of lower current/voltage than provided by the high voltage power supply or amplifier 316. This injected signal can be arranged in parallel to the high voltage line and can be injected to or meet the high voltage line at node 308. A chucking sensor 314 can couple to a low voltage side of a blocking capacitor 340, which can be arranged between the AC chuck monitoring source 310 and the node 308. A blocking capacitor 340 arranged between the AC chuck monitoring source 310 and the node 308 is selected to prevent high voltage from reaching the AC chuck monitoring source 310 or the chucking sensor 314. A notch or band stop filter 330 can be arranged between the node 308 and the high voltage power supply or amplifier 316 thereby preventing frequencies matching the injected frequency (e.g., 1 kHz-100 kHz) from reaching the high voltage power supply or amplifier 316.

In the illustrated embodiment, the notch or band stop filter 330 can include an inductor 332 and capacitor 334 in parallel, though other topologies for implementing the notch or band stop filter 330 are also within the design purview of those of skill in the art. The inductor 332 and capacitor 334 can be selected such that their combined effect is set to or filters the frequency of the low voltage AC chuck monitoring source 310. An RF filter 312 can be arranged between the node 308 and the wafer chuck 304, and can be formed from a series inductor 342 and a ground-referenced capacitor 344 coupled to the high voltage line between the node 308 and the series inductor 342.

As the low voltage injected signal is modulated, the chucking sensor 314 monitors the injected signal between the AC chuck monitoring source 310 and the blocking capacitor 340. The chucking sensor 314 can monitor current and voltage on the injection line and determine an impedance seen by the AC chuck monitoring source 310 based on these measurements, and from there determine a capacitance of the workpiece 302. This capacitance can be used to ascertain a quality or state of the chucking, and feedback can either be provided to an operator or used in a feedback loop to adjust parameters of the chucking (e.g., power supply or amplifier 316 power or frequency). For instance, the chucking sensor 314 can provide measurements or feedback to a controller 332, that can adjust the power supply or amplifier 316 and/or adjust a location of the wafer 302 via a wafer transfer unit 334. The wafer transfer unit 334 can be implemented as any number of different automated systems within a plasma processing chamber able to move the wafer 302. The wafer transfer unit 334 may include one or more arms, a thin platform, or any other structure for lifting and moving the wafer 302. In some cases, the wafer transfer unit 334 is contained entirely within the plasma processing chamber, while in others the wafer transfer unit 334 may be able to move between different vacuum chambers, for instance in a wafer processing assembly that performs batch wafer processing via multiple vacuum chambers.

Since the low voltage AC chuck monitoring source 310 can be designed independently from the high voltage requirements placed on the high voltage power supply or amplifier 316, the low voltage AC chuck monitoring source 310 can be selected to operate at a higher frequency than the high voltage power supply or amplifier 316. However, these two frequencies can also be synchronized, to the extent possible, to minimize beat frequency issues.

Although this disclosure primarily references a blocking capacitor 240, 340, the blocking capacitor 240, 340 can be replaced by any device or system of devices that can filter the high voltage signal and prevent the high voltage signal from reaching the low voltage AC chucking monitoring source.

Figure 6:
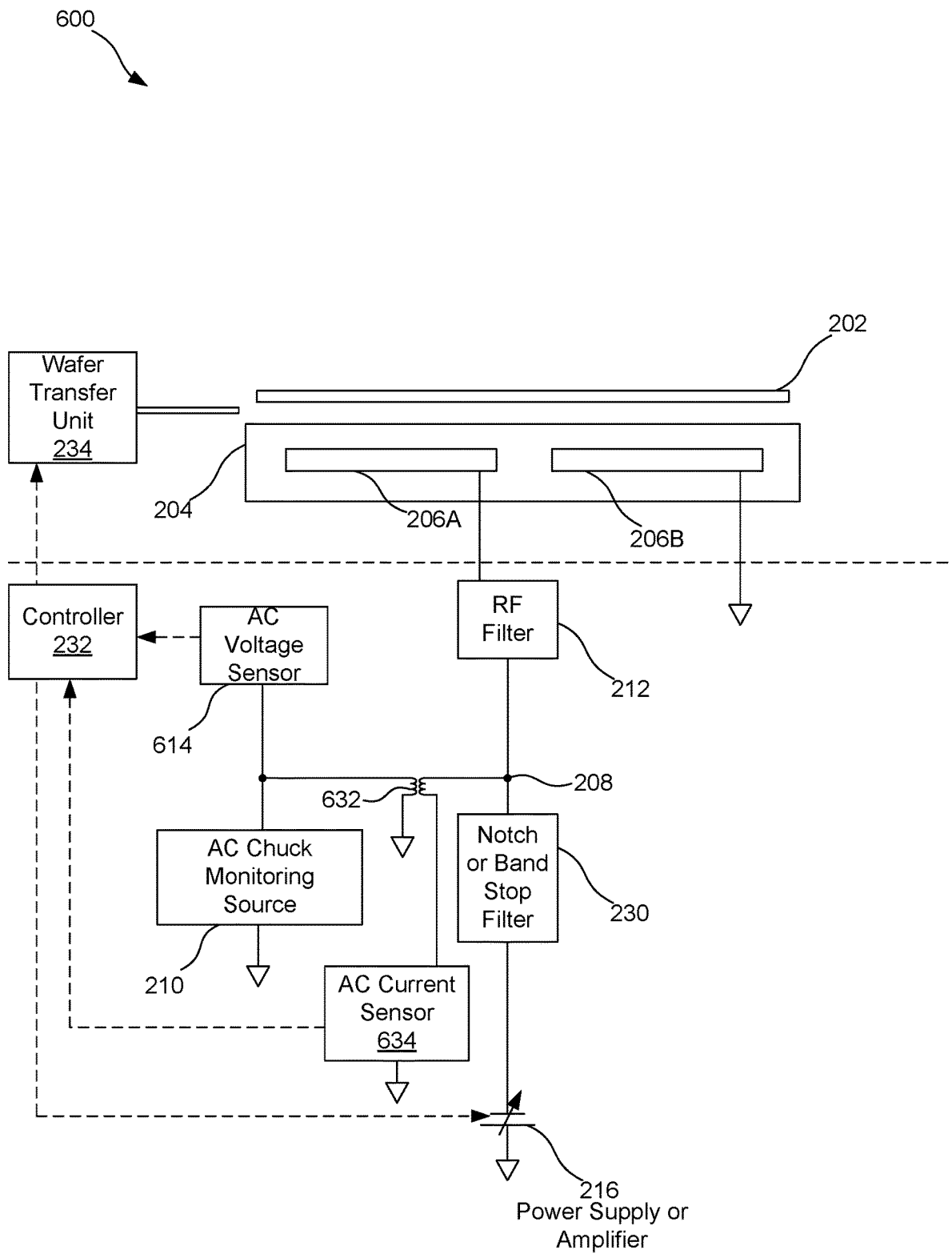
FIG. 6 illustrates yet another embodiment of a wafer chucking assembly using a ground-referenced low voltage AC injection signal, but with AC voltage measured through a primary of a transformer.
Figure 7:
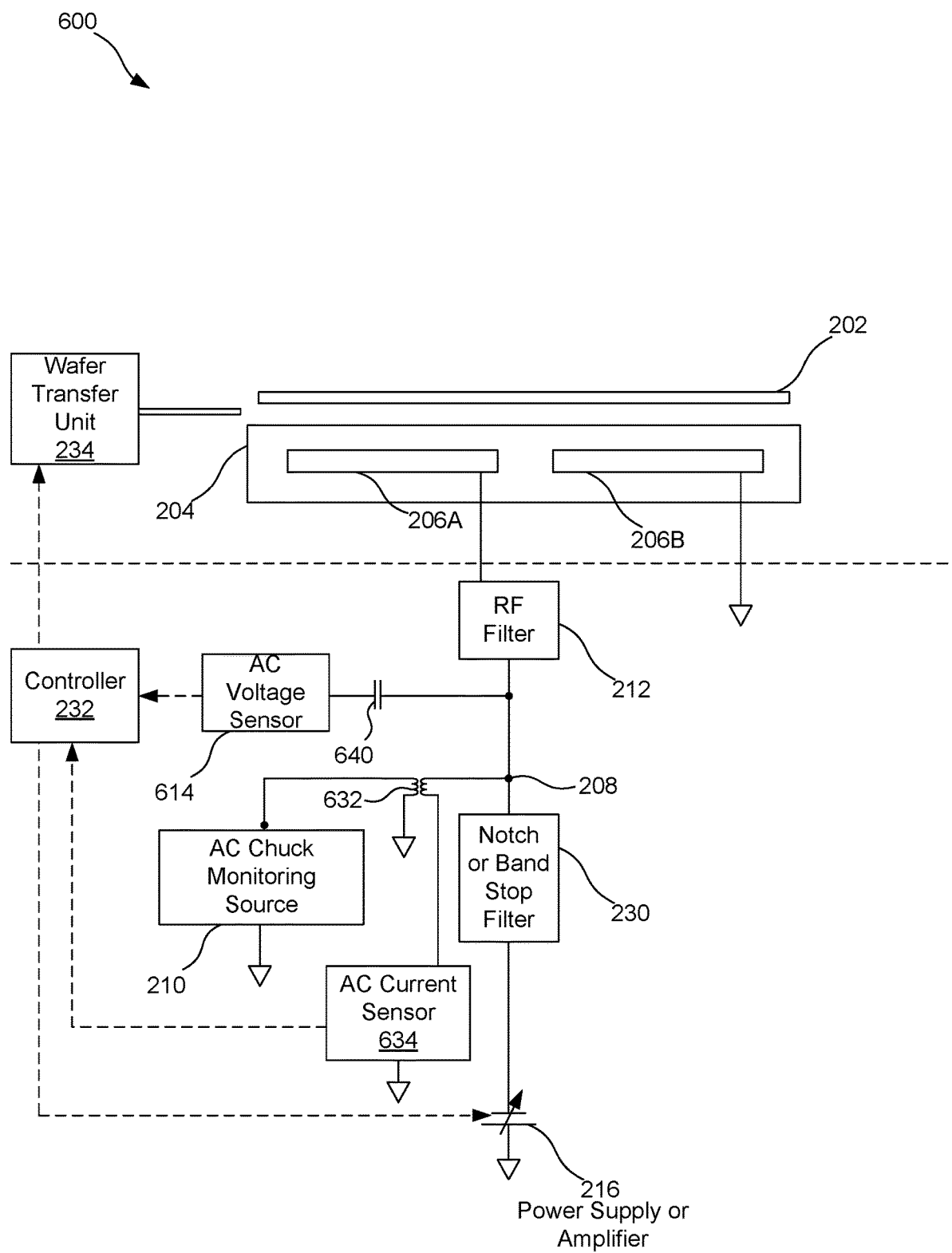
FIG. 7 illustrates yet another embodiment of a wafer chucking assembly using a ground-referenced low voltage AC injection signal, but with AC voltage measured through a secondary of a transformer.

For instance, FIGS. 6 and 7 illustrate embodiments where a transformer 632 can be used in place of the blocking capacitor 240, 340 to isolate the AC chuck monitoring source 210 from the high voltage signal. In FIG. 6 the transformer 632 comprises a primary side coupled between the AC chuck monitoring source 210 and ground, and a secondary side coupled between the node 208 and an AC current sensor 634. The transformer 632 can reduce or block lower frequency high voltage signals from the power supply or amplifier 216 from reaching the AC chucking monitoring source 210, while allowing the higher frequency signal from the AC chuck monitoring source 210 to be injected onto the high voltage line at the node 208. The transformer 632 also provides a means to monitor current via the AC current sensor 634 as well as to monitor low voltage AC via an AC voltage sensor 614 coupled to the primary side of the transformer 632 (between the AC chuck monitoring source 210 and the transformer 632). Both of these sensors 614, 634 can optionally provide feedback to the controller 232. The controller 232 can include a compensation factor to account for losses across the transformer 632. The transformer 632 can have a 1:1 turns ratio in one embodiment.

In FIG. 7 a transformer 632 comprises a primary side coupled between the AC chuck monitoring source 210 and ground, and a secondary side coupled between the node 208 and an AC current sensor 634. The transformer 632 can reduce or block lower frequency high voltage signals from the power supply or amplifier 216 from reaching the AC chucking monitoring source 210, while allowing the higher frequency signal from the AC chuck monitoring source 210 to be injected onto the high voltage line at the node 208. The transformer 632 also provides a means to monitor current via the AC current sensor 634 as well as to monitor low voltage AC via the AC voltage sensor 614 coupled to the secondary side of the transformer 632 via a capacitive element 640 (e.g., one or more series-coupled capacitors) to filter high voltage DC. Both of these sensors 614, 634 can optionally provide feedback to the controller 232. The controller 232 can include a compensation factor to account for losses across the transformer 632. The transformer 632 can have a 1:1 turns ratio in one embodiment.

As FIGS. 6 and 7 show, although the blocking capacitor 240 is one way to DC isolate the sensing section of the circuit from the high voltage signal, other means, such as use of an isolating transformer, are also possible.

Figure 4:
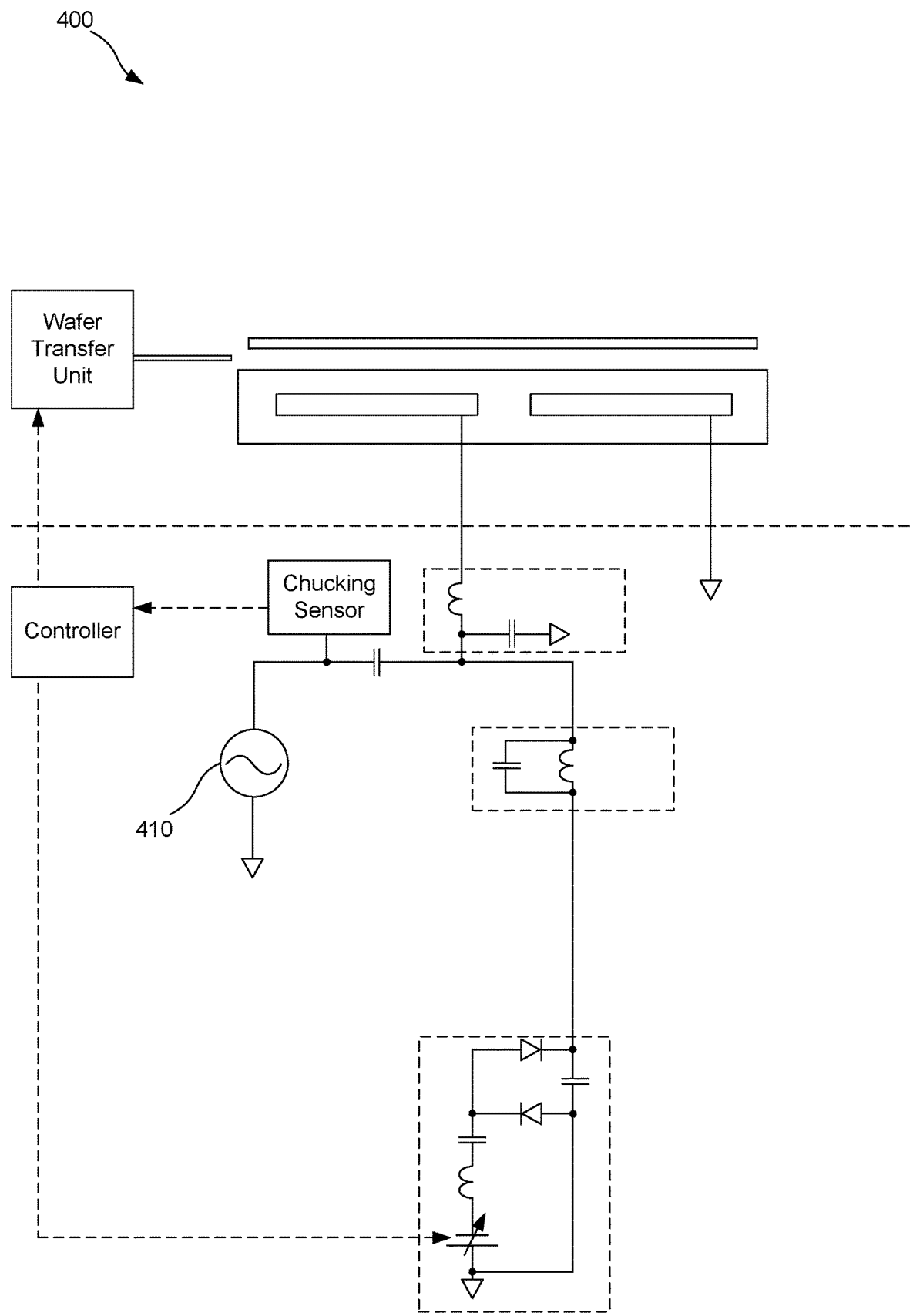
FIG. 4 illustrates yet another novel embodiment of a wafer chucking assembly using a ground-referenced low voltage AC injection signal.

FIG. 4 illustrates an alternative low voltage AC chuck monitoring source 410 to that shown in FIG. 3. Namely, the low voltage AC current source 310 is here replaced with a low voltage AC voltage source 410. All components of FIG. 4 not specifically labeled are the same as described in FIG. 3.

Figure 5:
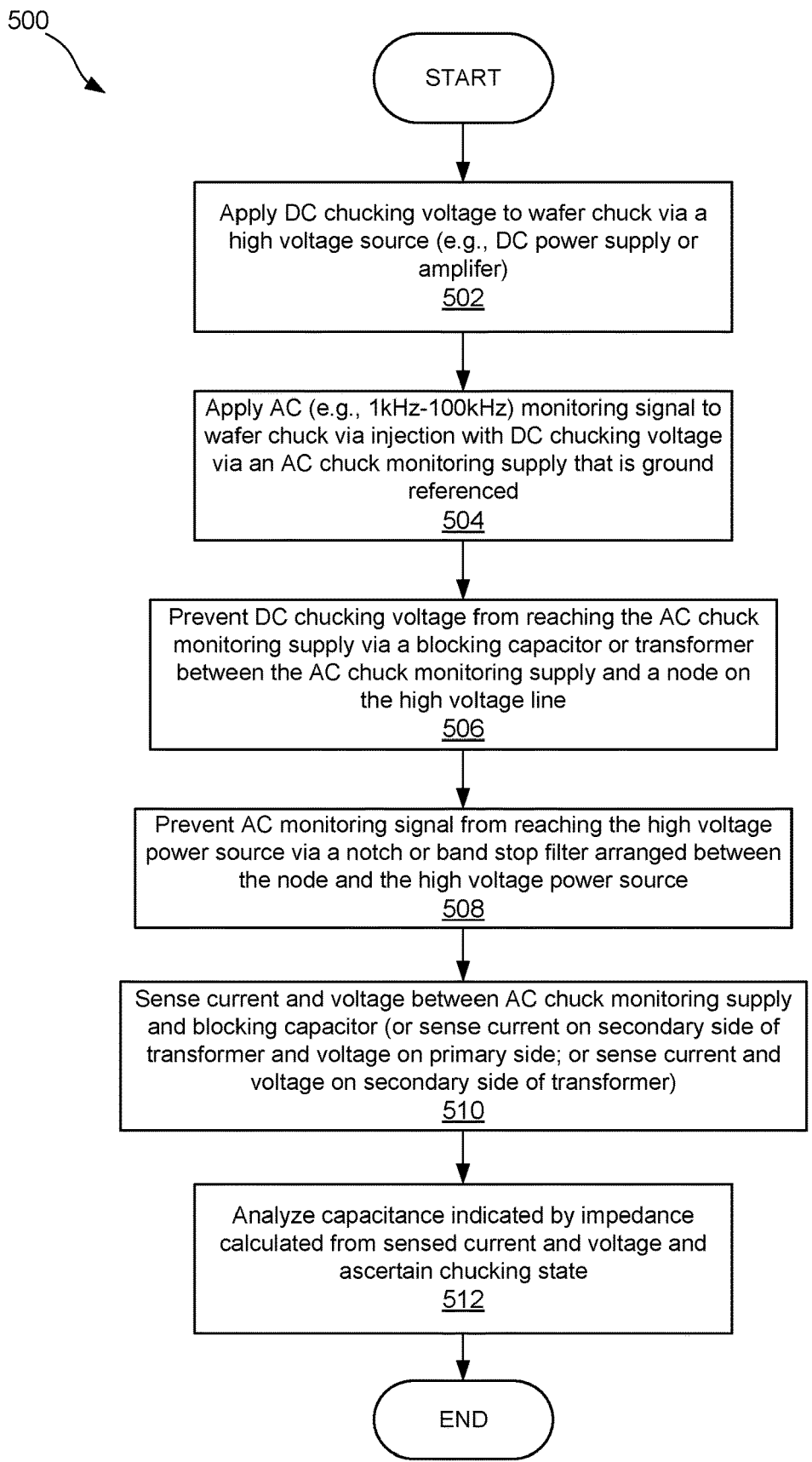
FIG. 5 illustrates a method of operating a chucking assembly to monitor chucking via an injected low voltage AC signal.

FIG. 5 illustrates a method of operating a chucking assembly to monitor chucking via a low voltage AC signal injected into the high voltage line via a blocking capacitor. The method 500 starts by application of a DC chucking voltage to a wafer chuck (Block 502) via a high voltage source such as a DC power supply or amplifier (e.g., 216 or 316). The method 500 can then apply a low voltage AC monitoring signal to the wafer chuck in parallel to the DC chucking voltage (Block 504) via an AC chuck monitoring supply that is ground-referenced. This injected AC monitoring signal can be at a lower voltage than the DC chucking voltage, but at a higher frequency than the DC chucking voltage. For instance, the injected AC monitoring signal could be ~1 kHz, or ~10 kHz, or ~100 kHz. A blocking capacitor (e.g., 240, 340) arranged between the AC chucking supply and a node (e.g., 208, 308) between an RF filter (e.g., 212, 312) and the DC power supply or amplifier can prevent the DC chucking voltage from reaching the AC chuck monitoring supply (Block 506) and maintain a low voltage side of the blocking capacitor where sensing of the chuck impedance can take place. A notch or bandstop filter (e.g., 230, 330) can be arranged between the node (e.g., 208, 308) and the high voltage source to prevent the AC monitoring signal from reaching the high voltage source (Block 508). The method 500 can sense current and voltage between the AC chuck monitoring supply and the blocking capacitor (Block 510). Said another way, current and voltage can be measured on a low voltage side of the blocking capacitor (Block 510). The method 500 can then analyze a capacitance indicated by impedance calculated from the sensed current and voltage, and can ascertain a chucking state (Block 512). Where a procedure to perform chucking is underway, and Block 512 shows that the substrate is improperly chucked, then a warning may be passed to an operator warning against moving forward with the procedure until the substrate is fully chucked. Where a procedure to remove the substrate is underway, and Block 512 shows that the substrate is not entirely de-chucked, then a warning may be passed to an operator warning against moving forward with the procedure until the substrate is fully de-chucked.

System accuracy can be further improved via one or more calibrations. For instance, in any of the embodiments discussed above, the injected signal's frequency can be swept within a range that that spans above and below the blocking frequencies in order to find a maximum impedance. This sweeping can be performed to best match the notch or band stop filter's characteristics. In other words, the sweeping can be performed to characterize a frequency of the blocking filter that shows a maximum impedance. Alternatively, a lookup table can be created by stepping the current or voltage of the injected signal into an open circuit (e.g., where the high voltage line is not coupled to the wafer chuck, but is instead left open at the output) and characterizing the resulting leakage through the notch or band stop filter and into the high voltage power supply. In another embodiment, the output of the high voltage line can be coupled to ground rather than the wafer chuck, and the injected signal's frequency can be swept to characterize voltage drops across the blocking capacitor.

Figure 8:
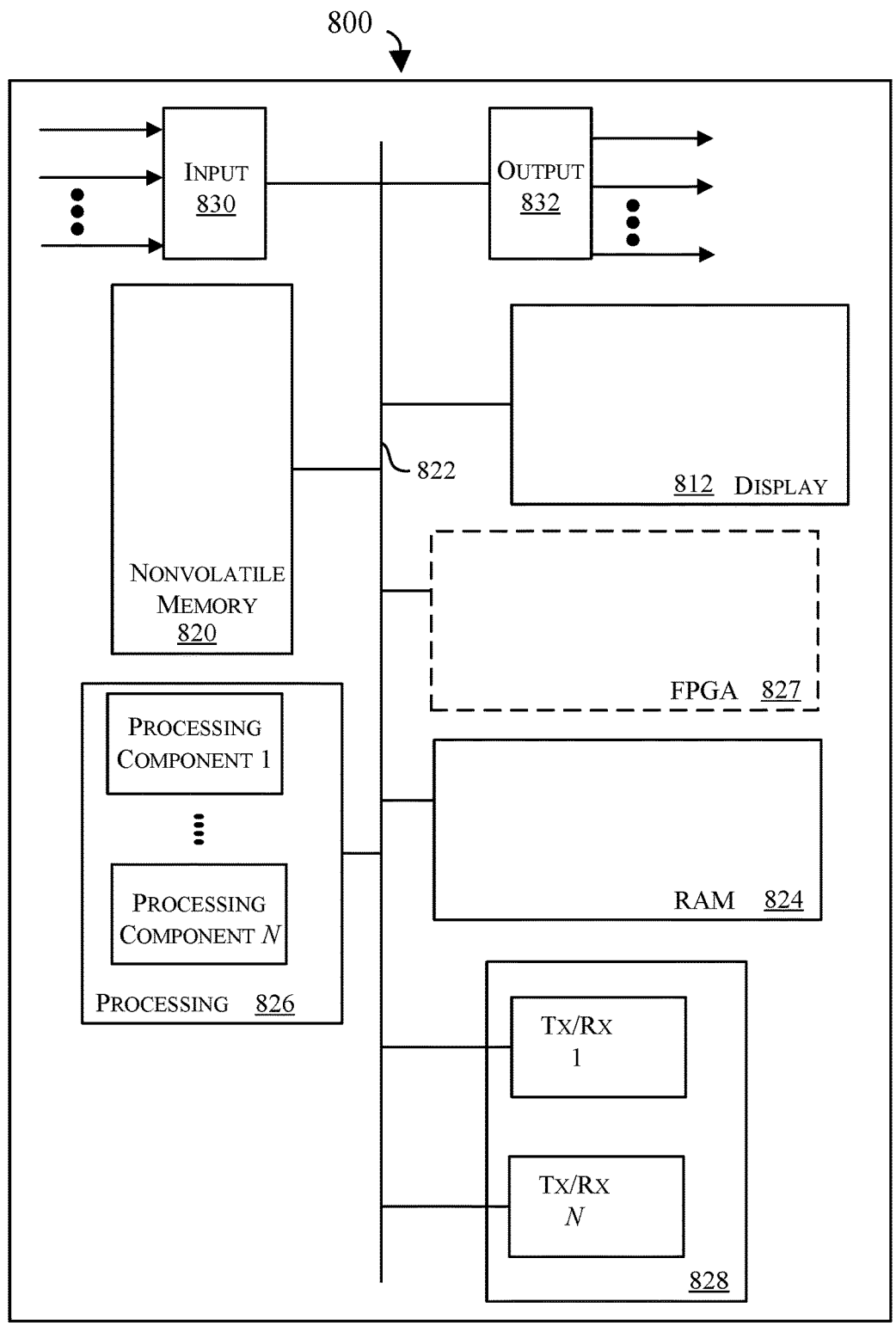
FIG. 8 is a block diagram depicting physical components that may be utilized to realize the wafer chucking assembly of FIGS. 2-4.

The methods described in connection with the embodiments disclosed herein may be embodied directly in hardware, in processor-executable code encoded in a non-transitory tangible processor readable storage medium, or in a combination of the two. Referring to FIG. 8 for example, shown is a block diagram depicting physical components that may be utilized to realize the controller 232 (and the wafer chucking assembly generally) according to an exemplary embodiment. As shown, in this embodiment a display portion 812 and nonvolatile memory 820 are coupled to a bus 822 that is also coupled to random access memory ("RAM") 824, a processing portion (which includes N processing components) 826, an optional field programmable gate array (FPGA) 827, and a transceiver component 828 that includes N transceivers. Although the components depicted in FIG. 8 represent physical components, FIG. 8 is not intended to be a detailed hardware diagram; thus many of the components depicted in FIG. 8 may be realized by common constructs or distributed among additional physical components. Moreover, it is contemplated that other existing and yet-to-be developed physical components and architectures may be utilized to implement the functional components described with reference to FIG. 8.

This display portion 812 generally operates to provide a user interface for a user, and in several implementations, the display is realized by a touchscreen display. For instance, the display portion 812 may include a user interface configured to provide a warning or other indicator to a user that a wafer is not properly chucked or has not been completely de-chucked. In general, the nonvolatile memory 820 is non-transitory memory that functions to store (e.g., persistently store) data and processor-executable code (including executable code that is associated with effectuating the methods described herein). In some embodiments for example, the nonvolatile memory 820 includes bootloader code, operating system code, file system code, and non-transitory processor-executable code to facilitate the execution of a method described with reference to FIG. 5 described further herein.

In many implementations, the nonvolatile memory 820 is realized by flash memory (e.g., NAND or ONENAND memory), but it is contemplated that other memory types may be utilized as well. Although it may be possible to execute the code from the nonvolatile memory 820, the executable code in the nonvolatile memory is typically loaded into RAM 824 and executed by one or more of the N processing components in the processing portion 826.

The N processing components in connection with RAM 824 generally operate to execute the instructions stored in nonvolatile memory 820 to enable monitoring of an impedance of the wafer chuck to thereby infer a state of chucking of the substrate on the wafer chuck. For example, non-transitory, processor-executable code to effectuate the methods described with reference to FIG. 5 may be persistently stored in nonvolatile memory 820 and executed by the N processing components in connection with RAM 824. As one of ordinarily skill in the art will appreciate, the processing portion 826 may include a video processor, digital signal processor (DSP), micro-controller, graphics processing unit (GPU), or other hardware processing components or combinations of hardware and software processing components (e.g., an FPGA or an FPGA including digital logic processing portions).

In addition, or in the alternative, the processing portion 826 may be configured to effectuate one or more aspects of the methodologies described herein (e.g., the method described with reference to FIG. 5). For example, non-transitory processor-readable instructions may be stored in the nonvolatile memory 820 or in RAM 824 and when executed on the processing portion 826, cause the processing portion 826 to perform monitoring of an impedance of the wafer chuck to thereby infer a state of chucking of the substrate on the wafer chuck. Alternatively, non-transitory FPGA-configuration-instructions may be persistently stored in nonvolatile memory 820 and accessed by the processing portion 826 (e.g., during boot up) to configure the hardware-configurable portions of the processing portion 826 to effectuate the functions of the controller 232.

The input component 830 operates to receive signals (e.g., an AC voltage from the chucking sensor 214 or an AC voltage from the AC voltage sensor 614 and/or an AC current from the AC current sensor 634) that are indicative of one or more aspects of the low voltage AC signal injected into the high voltage line at node 208. The output component generally operates to provide one or more analog or digital signals to effectuate an operational aspect of the wafer transfer unit 234.

The depicted transceiver component 828 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A wafer chucking monitor comprising:
    a voltage source configured to provide a voltage to a wafer chuck;
    an AC source configured to provide an AC monitoring signal to the wafer chuck via a node between the wafer chuck and the voltage source;
    a blocking capacitor arranged between the AC source and the node;
    a chucking sensor arranged between the blocking capacitor and the AC source and configured to monitor current and voltage on a low voltage side of the blocking capacitor;
    a filter arranged between the node and the voltage source; and
    a controller configured to receive the current and voltage from the chucking sensor and ascertain a chucking state.

2. The wafer chucking monitor of claim 1, wherein the voltage source is a DC power supply.

3. The wafer chucking monitor of claim 1, wherein the voltage source is an amplifier with a variable output.

4. The wafer chucking monitor of claim 1, wherein the controller is configured to control the voltage source or a wafer transfer unit in response to inferring from the current and voltage that a substrate is improperly chucked on the wafer chuck.

5. The wafer chucking monitor of claim 1, further comprising an RF filter between the node and an output configured to couple to the wafer chuck.

6. The wafer chucking monitor of claim 1, wherein the controller is configured to control the voltage source.

7. The wafer chucking monitor of claim 1, wherein the controller is configured to control a wafer transfer unit in response to inferring, from the current and voltage, that a substrate is improperly chucked on the wafer chuck.

8. The wafer chucking monitor of claim 1, wherein the controller is configured to control the voltage source in response to inferring, from the current and voltage, that a substrate is improperly chucked on the wafer chuck.

9. The wafer chucking monitor of claim 1, wherein the filter comprises a band stop filter.

10. The wafer chucking monitor of claim 1, wherein the filter comprises a notch filter.

11. A method comprising:
    applying a DC voltage to a wafer chuck in a plasma processing chamber via a voltage source;
    applying an AC monitoring signal to the wafer chuck via an AC chuck monitoring source;
    blocking the DC voltage from reaching the AC chuck monitoring source;
    preventing the AC monitoring signal from reaching the voltage source;
    sensing current and voltage of the AC chuck monitoring source; and
    analyzing the current and voltage between to ascertain a chucking state of the wafer chuck.

12. The method of claim 11 wherein applying the DC voltage comprises applying the DC voltage with a DC power supply.

13. The method of claim 12 wherein applying the DC voltage comprises applying the DC voltage with a constant output.

14. The method of claim 11 wherein applying the DC voltage comprises applying the DC voltage with an amplifier.

15. The method of claim 14 wherein applying the DC voltage comprises applying the DC voltage as a variable voltage.

* * * * *